United States Patent [19]
Abramsky et al.

[11] Patent Number: 5,907,798
[45] Date of Patent: May 25, 1999

[54] WIRELESS TELEPHONE INTERMODULATION PERFORMANCE ENHANCEMENT TECHNIQUES

[75] Inventors: Victor A. Abramsky, Edison; Andrzej Partyka, Bedminster, both of N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/668,268

[22] Filed: Jun. 21, 1996

[51] Int. Cl.$^6$ .............................. H04B 1/10; H04B 15/00
[52] U.S. Cl. ................. 455/249.1; 455/230; 455/67.3; 455/63; 455/135; 455/278.1; 455/296; 330/129; 330/279
[58] Field of Search ............................. 455/249.1, 230, 455/67.3, 135, 234.2, 278.1, 296, 63, 144, 277.2, 295; 330/270, 86, 96, 97, 129, 279

[56] References Cited

U.S. PATENT DOCUMENTS 3,619,786  11/1971  Wilcox .................................. 455/249.1
4,553,105  11/1985  Sasaki ................................... 455/249.1
4,665,560   5/1987  Lange .................................... 455/249.1
5,321,849   6/1994  Lemson ................................. 455/249.1

*Primary Examiner*—Donnie L. Crosland

[57] ABSTRACT

Improved radio receiver designs can be used in the operational environment of wireless telephone communications. The radio receiver includes a variable attenuator, a variable-current RF signal amplifier, and a controller. The controller controls the amount of attenuation provided by the variable attenuator, and/or the current consumed by the variable-current RF signal amplifier, in response to signals received by the RF signal amplifier. The controller adjusts the variable attenuator, and/or the RF signal amplifier, to achieve a minimum symbol error rate and/or to maximize the signal-to-noise and interference ratio for a desired signal, irrespective of the levels of any interfering signals received by the RF signal amplifier. In this manner, the variable attenuator, and/or the variable current RF signal amplifier, are adjusted to obtain just the right amount of intermodulation performance for a given set of receiving conditions. This technique saves operating current and minimizes noise figure because, in practice, interference conditions do not persist all of the time, and are usually of temporary duration.

24 Claims, 3 Drawing Sheets

FIG. 4
FUZZY CONTROLLER RULES

| CONDITIONS | | | | ACTION |
|---|---|---|---|---|
| $S_\alpha$ | $S_\beta$ | $S_{\alpha\beta}$ | $S_{Ic}$ | |
| 0 | 0 | 0/− | + | INCREASE Ic IF SER AT SER METER 133 > A NOMINAL SER (SERnom) (OR IF C/N AT (C,N) METER 129 < A NOMINAL C/N (C/Nnom) |
| 0 | 0 | + | x | INCREASE $\alpha$ AND DECREASE $\beta$ FOR ($\Delta\alpha$, $\Delta\beta$); DECREASE $\alpha$ AND INCREASE $\beta$ FOR (−$\Delta\alpha$, $\Delta\beta$) |
| x | x | x | x | DECREASE Ic IF SER < SERnom (OR C/N > C/Nnom); (IF Ic > Icnom) |
| x | x | x | 0 | DECREASE Ic; (IF Ic > Icnom) |
| +/− | x | x | x | INCREASE/DECREASE $\alpha$ |
| x | +/− | x | x | INCREASE/DECREASE $\beta$ |

FIG. 5

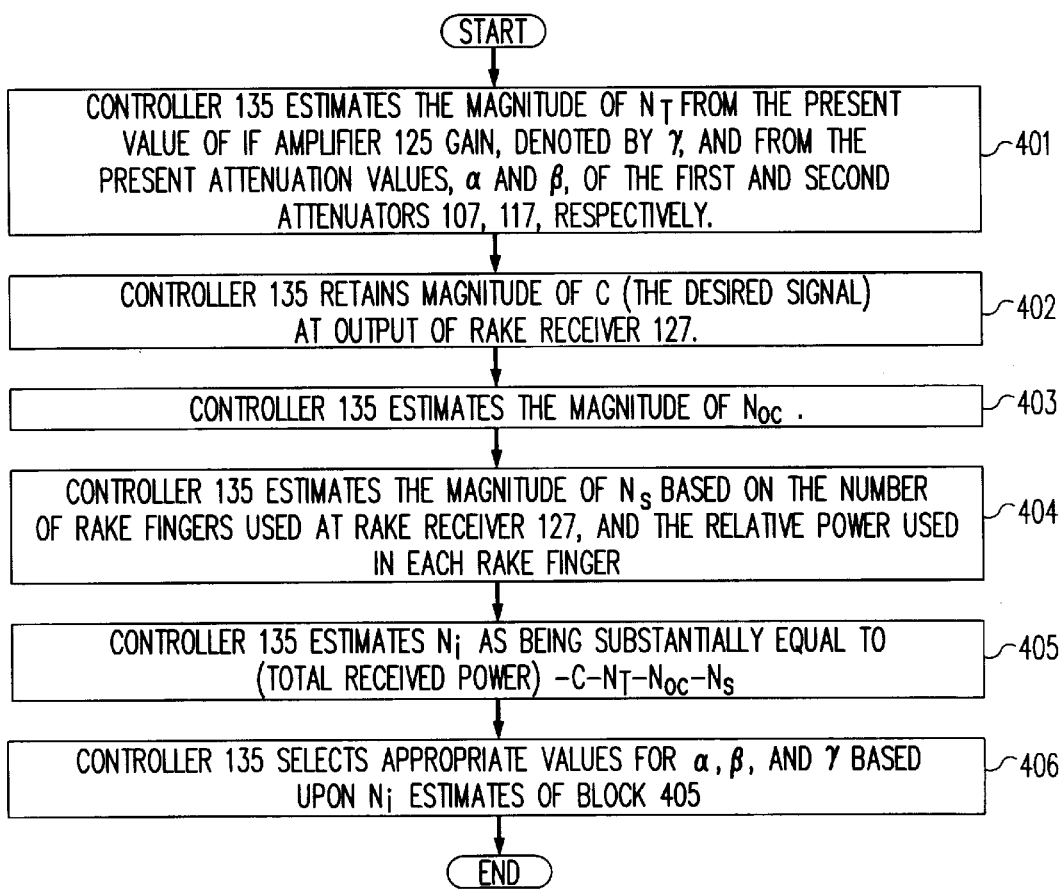

WIRELESS TELEPHONE INTERMODULATION PERFORMANCE ENHANCEMENT TECHNIQUES

BACKGROUND

1. Field of the Invention

The invention relates generally to radio receivers, and more specifically to radio receivers that are used for wireless telephone communications.

2. Description of Related Art

The field of wireless telephony is experiencing rapid growth. In order to increase the capacity of cellular communications systems, present efforts are being directed towards new modulation schemes, such as CDMA and TDMA. One characteristic of CDMA is that relatively broadband radio receiver designs must be employed. At the same time that these modulation schemes are enjoying more widespread acceptance, new cell sites and other radio communications systems are being constructed at an ever-increasing pace. Consequently, wireless telephone receivers must be able to effectively discriminate against many sources of interference.

The extent to which a wireless telephone receiver is immune to RF interference from nearby transmitters is determined by the intermodulation distortion characteristics of the receiver. As a general matter, broadband receivers are more susceptible to intermodulation distortion than narrowband receivers. These intermodulation distortions occur at the receiver front-end when the front end is exposed to strong undesired out-of-band signals as, for example, when the receiver is in close proximity to a cell site transmitter other than that from which the receiver is currently receiving a radio signal.

One conventional technique for improving intermodulation distortion problems addresses the design of the receiver front end. As a general matter, intermodulation performance can be improved by increasing the quiescent operating current of the active RF device or devices in the receiver front end. In order to obtain acceptable intermodulation performance in many real-world environments, the quiescent operating current must often be increased to an undesirably high level. In the case of stationary equipment connected to a 120-volt mains supply, the use of such a high current generally poses no great problem. However, a different situation exists with respect to portable equipment, where such a high current drain would very quickly deplete a set of fresh batteries. The user is inconvenienced by having to frequently change and/or recharge batteries. Such batteries may be expensive, and, if not, the frequent purchase of inexpensive batteries may also prove costly. Moreover, the user may be faced with a set of dead batteries in an emergency situation. What is needed is a technique for improving intermodulation performance while, at the same time, not significantly increasing the current consumption of the receiver.

SUMMARY OF THE INVENTION

Improved radio receiver designs are disclosed that can be used in the operational environment of wireless telephone communications. The radio receiver includes a signal input terminal, a variable-current RF signal amplifier, an input variable attenuator coupled between the signal input terminal and the input of the variable-current RF signal amplifier, an output variable attenuator coupled to the output of the variable-current RF signal amplifier, and a controller coupled to the input variable attenuator, the output variable attenuator, and the variable-current RF signal amplifier. The received signal, including any noise and/or interference, is coupled to the signal input terminal. The controller controls the amount of attenuation provided by the input variable attenuator and the output variable attenuator, and/or the current consumed by the variable-current RF signal amplifier, in response to signals received by the RF signal amplifier. The controller adjusts the variable attenuator, and/or the RF signal amplifier, to achieve at least a minimum acceptable signal-to-interference ratio for a desired signal, while the Noise Figure is not degraded any more than is necessary to achieve a minimum acceptable signal-to-interference ratio at any given time. In this manner, the input variable attenuator, the output variable attenuator, and/or the variable current RF signal amplifier, are adjusted to obtain a required amount of intermodulation performance for a given set of receiving conditions. This technique saves operating current and maintains fade margins because, in practice, interference conditions do not persist all of the time, and are usually of temporary duration. A first alternate embodiment uses an input variable attenuator but does not employ an output variable attenuator, and a second alternate embodiment uses an output variable attenuator but does not employ an input variable attenuator.

According to a further embodiment, the controller operates in the environment of an existing control loop, and provides a novel additional control loop. The existing control loop includes a mixer coupled to the output variable attenuator and/or to the RF signal amplifier, a variable gain IF amplifier coupled to the mixer, and a rake receiver coupled to the variable gain IF amplifier. The rake receiver includes an A-to-D converter and a rake correlator, and may, but need not, include an I/Q separator and an IF-to-baseband downconverter. The output of the rake correlator may be compared with the output of the A-to-D converter to determine a signal C/N (carrier-to-noise) ratio. The existing control loop adjusts the gain of the variable gain IF amplifier to maintain a constant (Signal+Noise) level at the A-to-D converter.

The novel additional control loop controls the amount of attenuation provided by the input variable attenuator, the output variable attenuator, and/or the current in the RF signal amplifier, in order to maintain the received signal quality above a nominal level and the current consumption as close as possible to a low nominal level. The controller uses the additional control loop to maintain the symbol error rate (SER) and/or the carrier to noise ratio (C/N) at a desired level. This embodiment is useful for improving the overall signal handling capability of a receiver, in that a strong desired signal is often accompanied by the presence of relatively strong undesired RF signals (i.e., interfering signals). Under these circumstances, additional attenuation improves receiver performance, irrespective of the intermodulation distortion characteristics of the RF signal amplifier.

BRIEF DESCRIPTION OF THE DRAWINGS

FIG. 4 is a table that describes a first method for selecting appropriate values for the attenuators of FIG. 1 using an illustrative set of fuzzy controller rules which the controller of FIG. 1 is programmed to implement.

FIG. 5 is a software flowchart illustrating a second method for selecting appropriate values for the first and second attenuators of FIG. 1, and for selecting an appropriate value for the RF signal amplifier current of FIG. 1.

DETAILED DESCRIPTION OF THE PREFERRED EMBODIMENTS

Figure 1:
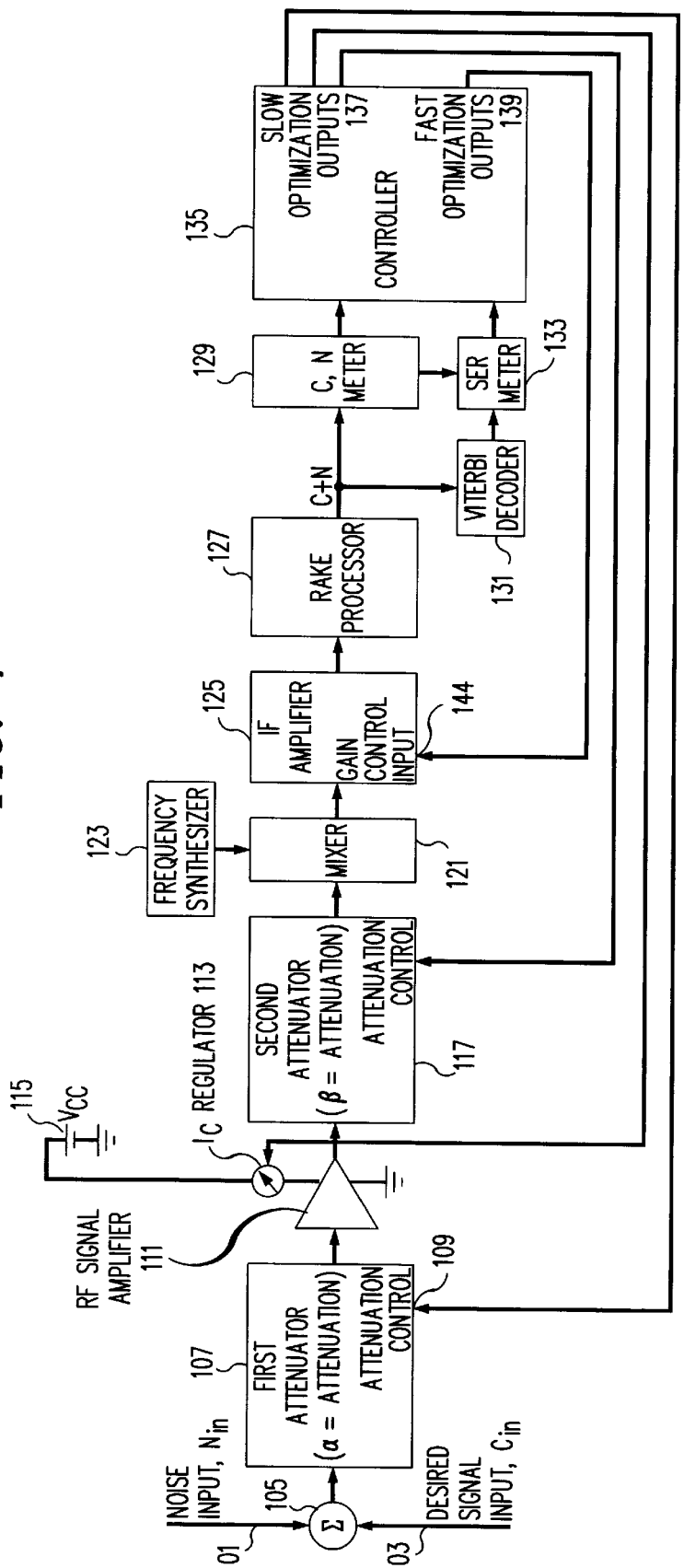
FIG. 1 is a hardware block diagram setting forth an illustrative embodiment of the invention disclosed herein.

FIG. 1 is a hardware block diagram setting forth an embodiment of the invention disclosed herein. Although the hardware configuration of FIG. 1 may be conceptualized as representing a receiver in a wireless telephone, the techniques disclosed herein are applicable to virtually any type of receiver. For example, the present invention encompasses not only receivers that are used in wireless telephone devices, but also receivers used by law enforcement agencies, public safety organizations, businesses, aircraft pilots, maritime operators, and the public at large, including consumer products such as stereos, car radios, shortwave radios, AM/FM radios, or the like.

In practical, real-world environments, the receiver of FIG. 1 receives a desired signal along with a certain amount of noise. Therefore, the input of a receiver may be conceptualized as a summer 105 that receives two inputs: a first input 101 that represents the sum of all sources of noise and interference including intermodulation interference, and a second input 103 that represents a desired signal. The intermodulation interference is actually generated in the receiver, but is shown here as already present at the input of the receiver for conceptual simplification. This conceptualization, known as "referring to the input", implies that a component, such as noise or interference, normally generated within the receiver, is shown as being applied to the input of the receiver, while the receiver is assumed to generate none of that component. The output of the summer is fed to the input of a first attenuator 107 having an adjustable attenuation denoted as α, and the output of the first attenuator is fed to the input of an RF signal amplifier 111. The attenuation of the first attenuator 107 is adjusted via an attenuation control 109 input. The current consumed by the RF signal amplifier 111 may be adjusted to a desired level via an amplifier current ($I_C$) regulator 113 that is placed in series with a voltage source $V_{CC}$ 115 that supplies DC power to the RF signal amplifier. The RF output of the RF signal amplifier 111 is coupled to a second attenuator 117 having an adjustable attenuation denoted as β. The attenuation of the second attenuator 117 is adjusted via an attenuation control 119 input.

The output of the second attenuator 117 is fed to a first input port of a mixer 121, and the output of a frequency synthesizer 123 is fed to a second input port of the mixer 121. Conventional devices well-known to those skilled in the art may be employed for mixer 121 and frequency synthesizer 123. In general, frequency synthesizer 123 includes a voltage-controlled oscillator, a phase comparator, a phase-lock loop, a buffer amplifier, and one or more multipliers/dividers. The function of frequency synthesizer 123 is to generate an RF carrier at a certain frequency such that, when the carrier and the desired signal are mixed at mixer 121, a specified frequency component appears at the output of mixer 121.

The output of mixer 121 is fed to the input of an intermediate frequency (IF) amplifier 125 having a gain control input 144 line which is used to control the gain, gamma, of the IF amplifier 125. Since the IF amplifier 125 output is typically fed to some type of detector (demodulator) stage, it is desirable for the output of the IF amplifier to be held at a relatively constant value. For example, if the IF amplifier 125 is used in a CDMA (code division multiple access) wireless telephone device, this detector stage is present in the form of a rake processor 127. One function of the gain control input 144 line is to permit the adjustment of IF amplifier 125 gain, such that a relatively constant signal level is present at the output of the IF amplifier, irrespective of the actual signal level at the output of mixer 121. In this manner, the receiver compensates for signal fluctuations in the total received (signal+noise+distortion) power at the output of summer 105 by adjusting the gain of the IF amplifier 125 to track received power changes. The received power can change due several reasons such as, for example, multipath fading, moving the receiver through an area having various terrain obstructions, moving the receiver towards, or away from, the cell site, and/or changing signal propagation or interference conditions. Note that the gain control input 144 line may be used to maintain the level of the desired signal, denoted as C, substantially at a constant level. Alternatively, the gain control input 144 line may be used to maintain a constant level of (desired signal+noise), denoted as (C+N).

The rake processor 127 is a digital signal processor designed to demodulate digitally-modulated signals such as CDMA spread spectrum signals. Note that, since the output of IF amplifier 125 is generally in analog form, an A/D converter is used at the output of the IF amplifier 125 to convert these analog signals to digital form. The A-to-D converter may be preceded by an IF-to-baseband downconverter and/or an I/Q separator. For purposes of the present example, the A/D converter, as well as any components between the A-to-D converter and the IF amplifier, are considered to be a part of the rake processor 127. The function and construction of rake processor 127 are well known to those skilled in the art and do not require additional explanation.

The output of rake processor 127, including noise components, denoted as N, along with desired signal components, denoted as C, is fed to both a Viterbi decoder 131 and a (C,N) meter 129. The Viterbi decoder 131 retrieves the digital information included in the desired signal components C, and the (C, N) meter 129 measures the level of C, as well as the level of N, present at the output of the rake processor 127. The output of Viterbi decoder 131 is passed to a signal error rate (SER) meter 133 which measures the error rate of the digital information decoded by Viterbi decoder 131. The signal error rate can be obtained from the Viterbi decoder 131 by re-encoding the decoded packets and comparing the resulting symbols with the received symbols.

The output of SER meter 133 and/or the output of (C, N) meter 129 are coupled to respective inputs of controller 135. Controller 135 includes a processing device, such as a microprocessor, and may optionally include logic gates, flip-flops, buffers, comparators, operational amplifiers, and/or resistive networks. The function of controller 135 is to monitor the outputs of (C, N) meter 129 and/or SER meter 133 and, in response to these outputs, generate a group of first control signals and a second control signal. The group of first control signals may be a function of the (C, N) meter 129 output only, the SER meter 133 output only, or a function that includes both the (C, N) meter 129 output and the SER meter 133 output. The second control signal keeps the received power level constant at the input to the rake receiver 127.

The controller 135 places the group of first control signals on a group of output lines termed the slow optimization outputs 137. The second control signal is placed on an output line termed the fast signal tracking output 139. To this end, the controller 135 generates the group of first control signals to compensate for relatively slow variations in the interference which generates intermodulation distortion.

A first output of the slow optimization outputs 137 is coupled to the first attenuator 109, and is used to control the amount of attenuation, alpha, provided by the first attenuator. A second output of the slow optimization outputs 137 is coupled to the $I_C$ regulator 113, and is used to control the amount of current drawn by the RF signal amplifier 111. A third output of the slow optimization outputs 137 is coupled to the second attenuator 117, and is used to control the amount of attenuation, beta, provided by the second attenuator. In this manner, controller 135 adjusts first attenuator 107, second attenuator 117, and current regulator 113 in response to signals received from (C, N) meter 129 and/or SER meter 133.

A first control loop includes the output of the (C, N) meter 129, and/or the output of the SER meter 133, coupled to controller 135, where controller 135 uses one or both of these outputs to control the slow optimization outputs 137 that are applied to the first attenuator 107, the second attenuator 117, and the $I_C$ regulator 113 for RF signal amplifier 111. The function of the second control loop, which could also be termed an AGC loop, is to react fast to changing signal values. The function of the first control loop, which could also be termed an optimizing loop, is to react to changing signal conditions. In operation, controller 135 adjusts the values of the attenuators and the RF signal amplifier current to optimize receiver performance for the present set of receiving conditions as reflected in the outputs of the SER meter 133 and/or the (C, N) meter 133. In one preferred implementation, a fuzzy logic controller is used in controller 135. A simple and robust control is obtained based on a few predefined rules which the controller 135 uses in the receiver optimization process. The values of attenuation and amplifier current are optimized for a given set of receiving conditions, irrespective of receiver component variations due to manufacturing processes and temperature excursions.

The following principles are applicable to the first and second attenuators 107, 117. In general, attenuators may be employed to reduce the signal-to-high-order-interference (C/Ni ratio).

attenuation is increased, the Noise Figure of the radio receiver increases, but this increase occurs at a slower rate than the rate of decrease of Ni.

Figure 2:
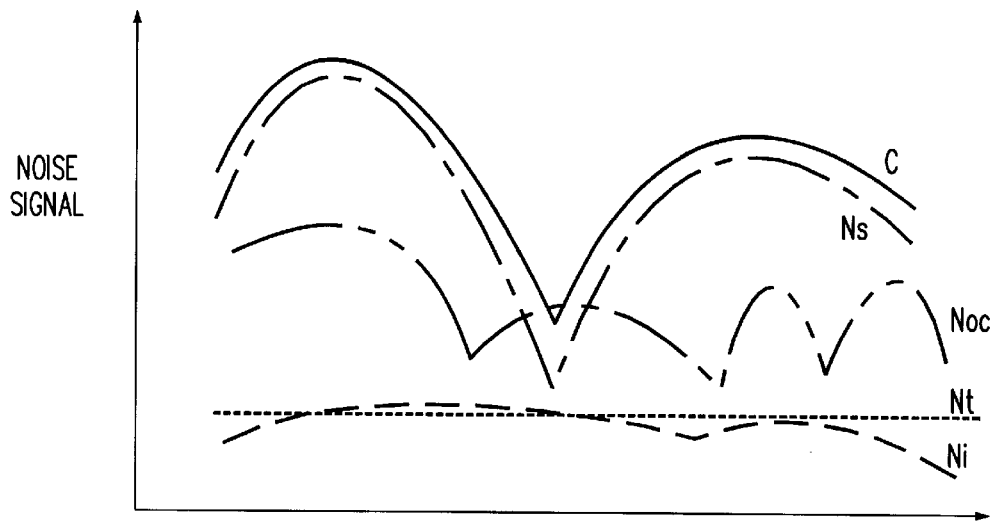
FIG. 2 is a graph depicting the relative magnitude of a desired signal, and the relative magnitudes of various sources of noise and interference, versus time, for a typical radio receiving environment.

The receiver of FIG. 1 may be employed in a mobile environment where the field strength of the signal to be received, as well as the received noise, fluctuates with time and/or distance. Refer to FIG. 2 which illustrates typical variations of received signal strength and received noise components. In the operational environment of CDMA, these noise components include:

Self induced noise from other users of the same CDMA channel—Ns. Note that this noise tracks the received signal power.

Noc—Noise from other CDMA cells which are relatively far away, but at the same frequency as the desired signal; this noise is subject to fading in the same way as the desired signal. However, these variations are not correlated with the variations in the desired signal.

Nt—thermal noise from the receiver front-end; this value is determined by the receiver noise figure (NF) which, in turn, depends upon the amounts of attenuation, $\alpha$ and $\beta$, applied by first and second attenuators 107, 117, respectively (FIG. 1), and is also determined, to a somewhat lesser degree, by the amount of current drawn by RF signal amplifier 111 and controlled by Ic regulator 113.

Ni—intermodulation products caused by strong-out-of-band signals and nonlinearities in the front-end. The levels of these intermodulation products depend upon $\alpha$, $\beta$, and Ic. Ni is referenced to the antenna input.

Most of these components are varying relatively fast when the receiver is in motion, such as, for example, in a car. However, the signal and noise conditions (average values, Doppler frequency etc.) are relatively slow-varying.

Figure 3:
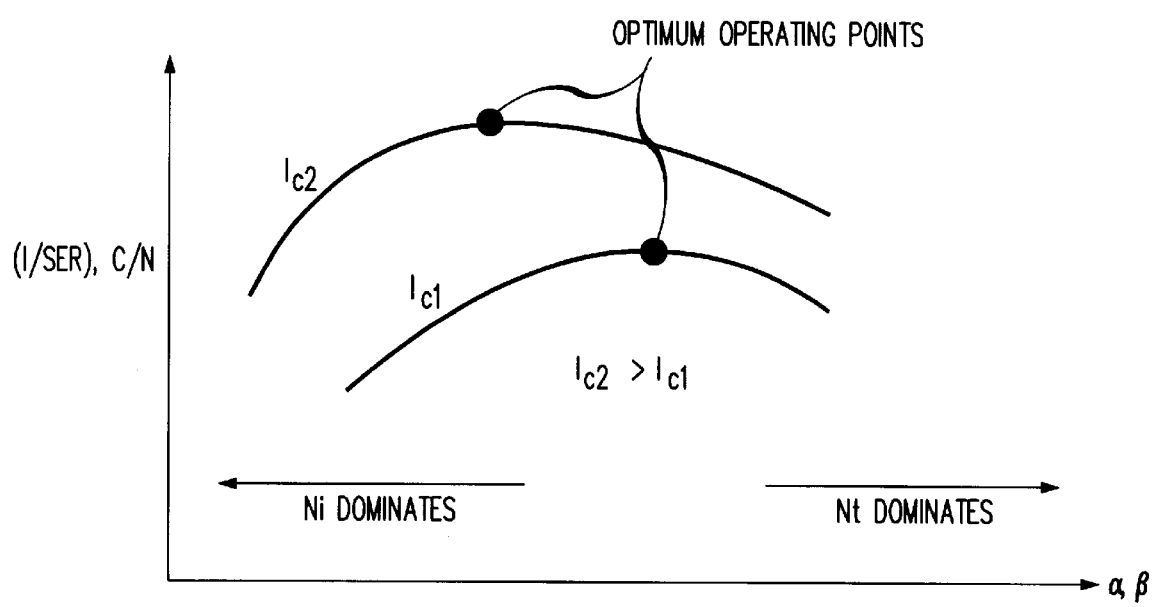
FIG. 3 is a graph depicting the relative signal-to-noise ratio of a received signal versus the settings of the attenuators of FIG. 1 for two values of RF signal amplifier current.

FIG. 3 sets forth an illustrative relationship between receiver intermodulation performance and the values for parameters $\alpha$, $\beta$, and Ic. This FIG. is useful for the purpose of developing illustrative methods by which controller 135 selects appropriate values for these parameters. For a certain amount of intermodulation interference and a set value of Ic, there exists a set of values $\alpha_0$, $\beta_0$, for which the receiver performance is the best. In other words, even though a further increase in attenuation beyond these values will decrease intermodulation distortion, the resultant increase in noise figure will outweigh any benefit from reduced intermodulation distortion. However, even if the "optimum" values of attenuation are selected, additional improvement

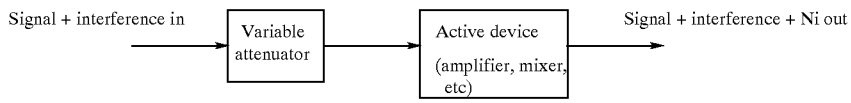

Note that the output third-order intercept point of the attenuator is much higher than the input third-order intercept point of circuitry, such as an amplifier or a mixer, which follows the attenuator. This characteristic commonly occurs in conjunction with pin diode or switched-resistor attenuators which have very high third-order intercept points. As the attenuation of an adjustabe attenuator is increased, an increase of X dB attenuation produces greater than X dB improvement in C/Ni at the output of an active device which follows the attenuator. Commonly, an increase of 1 dB in the attenuator would produce a 2 dB improvement in C/Ni, where Ni is the 3rd order intermodulation product. As in intermodulation distortion reduction is possible if the RF signal amplifier 111 current is increased. Note that RF signal amplifier 111 may, but need not, be a low-noise amplifier, denoted as LNA. In this case the third-order intercept point, denoted as IP3, of the RF signal amplifier 111 itself is increased. Consequently, the attenuator value $\alpha$ for the first attenuator 107 can now be decreased; the noise figure will then be reduced, and the IP3 will be increased. In effect, the optimum operating point of the attenuators changes to $\alpha_1$, $\beta_1$. Therefore, in this example, controller 135 is programmed to set the attenuation of the attenuators at $\alpha_1$, $\beta_1$, and to set the current of the RF signal amplifier 111 at a corresponding "optimum" value.

In a typical application, the third-order intercept point of the RF signal amplifier 111 (referred to at a common reference point such as the antenna input), and at an RF signal maplifier current Ic of Icnom, is only slightly better than the third-order intercept point of the mixer 121 (referred to at the same reference point). If strong interference is present along with a strong desired signal, the attenuators α, β, can be adjusted to increase the receiver IP3 at the expense of noise figure. If the signal is strong, this tactic may prove acceptable. However, in some cases, strong interference may exist along with a weak desired signal. In such a case, the third-intercept point (IP3) of the RF signal amplifier 111 is improved by increasing its current Ic. At the same time, the attenuation α of first attenuator 107 can be lowered because the RF signal amplifier 111 does not need as much "protection" as before, and the attenuation β of the second attenuator 117 is increased in order to maintain the level of mixer 121 intermodulation products at the previous level. When compared with the strong-signal, strong-interference situation, there is a net gain in noise figure with IP3 intact at the expense of the RF signal amplifier 111 current. The excessive RF signal amplifier current is only used when needed.

FIG. 4 is a table that describes an illustrative set of fuzzy controller rules which controller 135 may be programmed to implement. Note that FIG. 4 sets forth fuzzy control rules for purposes of illustration only, as it is to be understood that non-fuzzy control rules could alternatively be applied. In FIG. 4, the symbols $S_\alpha$, $S_\beta$, and $S_{Ic}$ denote the sensitivity of a specified control parameter to changes in the parameters α, β, and Ic, respectively. These sensitivities are defined as: $Sx=Sign(\Delta x)*\{SER(x_0)-SER(x_0+\Delta x)\}$; where x denotes the changing parameter (α, β, or Ic). $S_{\alpha\beta}$ is one of the two:

$SER(\alpha_0, \beta_0)-SER(\alpha_0+\Delta\alpha, \beta_0-\Delta\beta)$ or $SER(\alpha_0, \beta_0)-SER(\alpha_0-\Delta\alpha, \beta_0+\Delta\beta)$. Pursuant to a first embodiment, symbol error rate (SER) is used as the control parameter. The SER meter 133 (FIG. 1) obtains SER from the Viterbi decoder 131 by reencoding the decoded packets and comparing the resulting symbols with the received symbols. Alternatively, pursuant to a second embodiment, signal-to-noise ratio (C/N) is used as the control parameter. The signal-to-noise ratio is measured by the (C, N) meter 129 at the rake processor 127 output.

As used in FIG. 4, the symbol + means positive sensitivity, − means negative sensitivity, and x means "don't care". The sensitivity, Sx, is obtained by perturbing the parameter x and measuring the resulting difference in SER. Due to signal fluctuation, filtering (e.g. averaging) is performed to obtain Sx. In effect, the parameter x is dithered around its current nominal value. The amount of dither (Δx) is an important value which is carefully determined in order to optimize the response time of the controller 135 (FIG. 1). Note that controller 135 response can be improved if the changes made to x are proportional to the sensitivity Sx.

The open-loop method described in FIG. 5 is useful in some special circumstances, such as when there is a sudden increase in interference, or when the receiver has just been turned on in a high interference environment. The controller response can be improved if the present amount of intermodulation distortion (the IM value) is estimated, and the attenuators and Ic are preset to suppress exactly this value of IM, before the recursive optimization begins. This method can be used in conjunction with the fuzzy controller method described above as a way to quickly estimate the initial values of α, β and $I_c$ before beginning the optimization procedure that uses fuzzy control rules. This will speed up the response time of controller 135 in the aforementioned set of circumstances. The method of FIG. 5 may be employed without using the optimization procedure that uses fuzzy control rules, but may yield less accurate results.

Referring now to FIG. 5, an illustrative method by which controller 135 may estimate a value for the parameter Ni is described. The flowchart of FIG. 5 commences at block 401, where the controller 135 (FIG. 1) estimates the magnitude of Nt from the current value of IF amplifier 125 gain γ, α and β (attenuation of the attenuators). There is exactly one value of Nt for each combination of γ, α, β (ignoring temperature variations and component tolerances). This value is known apriori from the system design and can be stored in a look up table or obtained from a mathematical expression.

Next, at block 402, the controller 135 obtains the magnitude of C (desired signal) at the output of the rake receiver 127. Program control continues to block 403, where the controller 135 estimates the magnitude of Noc. In a CDMA system, this estimate is based on the current relative power of the Neighbor Pilots. Note that the current IS-95 interoperability standard requires CDMA mobiles to continually monitor these values. Noc is estimated as that fraction of the Total Received Power by taking the ratio of the Neighbor Pilots Power to the Total received Power. In case the Neighbor Pilot strength is not available, a constant can be substituted for the estimated value of Noc.

At block 404, the controller 135 estimates the magnitude of Ns based on the number of rake fingers used at rake receiver 127, and the relative power of signal in each rake finger. A value of Ns can be assigned apriori for each range of values. Next (block 405), the controller estimates Ni= (Total received power)−C−Nt−Noc−Ns.

Now that the magnitude of the interference component Ni is known, controller 135 can now select the values of the attenuators and Ic which were preprogrammed into the phone based on the theoretical analysis of Ni rejection vs. α, β and Ic (block 406).

Although the examples described above in connection with FIG. 1 utilize adjustable attenuators and a RF signal amplifier with a fixed gain and an adjustable current consumption, the invention also encompasses other structural topologies. For example, the aforementioned combination of attenuators and RF signal amplifier with fixed gain is functionally equivalent to a RF signal amplifier with adjustable gain. Moreover, the use of two attenuators was described for illustrative purposes, it being understood that the invention may encompass the use of a greater or lesser number of adjustable attenuators in the RF signal path, and/or structures which are functionally equivalent to the use of one or more adjustable attenuators. For example, a third adjustable attenuator could be employed between the mixer and the IF amplifier. Alternatively, one of the two described adjustable attenuators could be eliminated from the receiver design. Although some of the examples described herein operate in the environment of CDMA wireless telephony, these techniques are also applicable to radio receivers other than CDMA.

We claim:

1. A radio receiver characterized by:

(a) an adjustable attenuator;

(b) a control signal generator for producing a control signal indicative of the presence of receiver intermodulation and other noise after processing of a desired signal by the radio receiver; and (c) means for controlling the adjustable attenuator in response to the control signal to obtain a desired performance for a given set of receiving conditions.

2. The radio receiver of claim 1 further comprising a current regulator, coupled to an RF signal amplifier, for regulating the amount of DC current consumed by the RF signal amplifier, and wherein the means for controlling is adapted to control the current regulator in response to the control signal.

3. In a system including a radio receiver having an attenuator, a method comprising the steps of:
(a) producing a control signal indicative of the presence of receiver intermodulation and other noise after processing of a desired signal by the radio receiver;
(b) controlling said attenuator utilizing said control signal to obtain a desired performance for a given set of receiving conditions.

4. The method of claim 3 further including the steps of:
(a) the receiver receiving a plurality of signals including a desired signal accompanied by intermodulation interference; and
(b) adjusting the attenuation of the attenuator in such a way that intermodulation interference is reduced.

5. The method of claim 3 further including the steps of:
(a) the receiver receiving a plurality of signals including a desired signal; and
(b) adjusting the attenuation of the attenuator in response to the control signal to decrease the symbol error rate (SER) of the desired signal.

6. The method of claim 3 further including the steps of:
(a) the receiver receiving a plurality of signals including a desired signal; and
(b) adjusting the attenuation of the attenuator in response to the control signal to maximize the signal-to-noise (C/N) ratio of the desired signal.

7. The method of claim 3 wherein the radio receiver includes an amplifier current regulator coupled to an RF signal amplifier for regulating the amount of DC current consumed by the RF signal amplifier, the method further including the steps of:
(a) the receiver receiving a plurality of signals including a desired signal accompanied by intermodulation interference;
(b) adjusting the attenuation of the attenuator in response to the control signal to reduce the intermodulation interference; and
(c) adjusting the current regulator in response to the control signal to reduce the intermodulation interference, such that step (b) is performed prior to, after, and/or concurrently with, step (c).

8. The method of claim 3 for use with a radio receiver having an RF signal amplifier and an amplifier current regulator coupled to the RF signal amplifier for regulating the amount of DC current consumed by the RF signal amplifier, the method further including the steps of:
(a) the receiver receiving a plurality of signals including a desired signal accompanied by intermodulation interference;
(b) adjusting the attenuation of the attenuator in response to the control signal to minimize the symbol error rate (SER) of the desired signal; and
(c) adjusting the current regulator to reduce the symbol error rate (SER) of the desired signal, such that step (b) is performed prior to, after, and/or concurrently with, step (c).

9. The method of claim 8 further including the step of adjusting the third-order intercept point of the radio receiver based upon a set of fuzzy logical rules applied to the signal-to-noise ratio of the desired signal.

10. The method of claim 8 further including the step of adjusting the third-order intercept point of the radio receiver based upon a set of fuzzy logical rules applied to the symbol error rate (SER) of the desired signal.

11. The method of claim 8 wherein magnitude and direction of changes in symbol error rate (SER) are determined by dithering the attenuation of the attenuator and by dithering the current regulated by the current regulator.

12. The method of claim 11 wherein the dithering is performed by incrementing and/or decrementing the attenuation of the attenuator, and by incrementing and/or decrementing the current regulated by the current regulator, such that the increments and/or decrements of the attenuator, and the increments and/or decrements of the current, are proportional to the sensitivity of the SER to incremental changes in, respectively, the attenuation of the attenuator, and the current regulated by the current regulator.

13. The method of claim 3 for use with a radio receiver having an RF signal amplifier and an amplifier current regulator coupled to the RF signal amplifier for regulating the amount of DC current consumed by the RF signal amplifier, the method further including the steps of:
(a) the receiver receiving a plurality of signals including a desired signal accompanied by intermodulation interference;
(b) adjusting the attenuation of the attenuator in response to the control signal to maximize the signal-to-noise ratio of the desired signal; and
(c) adjusting the current regulator in response to the control signal to maximize the signal-to-noise ratio of the desired signal, wherein steps (b) and (c) are performed concurrently and/or in any order.

14. The method of claim 13 wherein magnitude and direction of changes in signal-to-noise ratio of the desired signal are determined by dithering the attenuation of the attenuator and by dithering the current regulated by the current regulator.

15. The method of claim 14 wherein the dithering is performed by incrementing and/or decrementing the attenuation of the attenuator, and by incrementing and/or decrementing the current regulated by the current regulator, such that the increments and/or decrements of the attenuator, and the increments and/or decrements of the current, are proportional to the sensitivity of the signal-to-noise ratio to incremental changes in, respectively, the attenuation of the attenuator, and the current regulated by the current regulator.

16. The method of claim 13 further including the step of adjusting the third-order intercept point of the radio receiver based upon a set of fuzzy logical rules applied to the signal-to-noise ratio of the desired signal.

17. The method of claim 13 further including the step of adjusting the third-order intercept point of the radio receiver based upon a set of fuzzy logical rules applied to the symbol error rate (SER) of the desired signal.

18. The method of claim 3 further including the step of adjusting the attenuator to provide no greater than a specified amount of receiver intermodulation.

19. A method of estimating the amount of intermodulation distortion present in a radio receiver having an RF signal amplifier, an antenna input terminal, a mixer, an adjustable attenuator, an adjustable current regulator for adjusting the DC current consumption of the RF signal amplifier, and a processor for adjusting the attenuator, for adjusting the adjustable current regulator, for measuring the signal-to-noise ratio of the desired signal, and for measuring the signal strength of the desired signal, the method including the steps of:

(a) the processor measuring the received signal strength and the signal-to-noise ratio of the desired signal;

(b) the processor estimating the amount of the receiver-generated thermal noise based on the present amount of attenuation provided by the adjustable attenuator, and the present amount of current regulated by the adjustable current regulator, to develop a control signal for adjusting the adjustable attenuator and the adjustable current regulator in response to the measurements of received signal strength and signal-to-noise ratio.

20. The method of claim 19 wherein the radio receiver is adapted for use with a CDMA (code division multiple access) wireless telephone system and the processor includes means for measuring the neighbor pilot strength of a CDMA RF carrier signal, the method further including the step of the processor estimating intermodulation distortion performance based upon measurements of the neighbor pilot strength.

21. The method of claim 20 wherein the radio receiver includes a rake receiver having a plurality of rake fingers, each rake finger including signal strength measuring means for measuring the signal strength of the desired signal during a corresponding time duration, the method further including the step of the processor estimating intermodulation distortion performance based upon measurements of signal strength at each of a plurality of rake fingers.

22. A method of RF interference rejection as set forth in claim 19 and for use with a radio receiver having an RF signal amplifier, an antenna input terminal, a mixer, a first adjustable attenuator coupled between the antenna input terminal and the RF signal amplifier, a second adjustable attenuator coupled between the RF signal amplifier and the mixer, an adjustable current regulator for adjusting the DC current consumption of the RF signal amplifier, and a processor for adjusting the first and second adjustable attenuators, for adjusting the adjustable current regulator, for measuring the signal-to-noise ratio of the desired signal, and for measuring the signal strength of the desired signal, the method including the steps of the processor adjusting the intermodulation distortion performance of the radio receiver by:

(a) the processor measuring the received signal strength and the signal-to-noise ratio of the desired signal;

(b) estimating receiver-generated thermal noise as set forth in claim 19;

(c) the processor adjusting first and second adjustable attenuators and the adjustable current regulator in response to the measurements of received signal strength and signal-to-noise ratio.

23. The method of claim 22 wherein the radio receiver is adapted for use with a CDMA (code division multiple access) wireless telephone system and the processor includes means for measuring the neighbor pilot strength of a CDMA RF carrier signal, the method further including the step of the processor estimating intermodulation distortion performance based upon measurements of the neighbor pilot strength.

24. The method of claim 22 wherein the radio receiver includes a rake receiver having a plurality of rake fingers, each rake finger including signal strength measuring means for measuring the signal strength of the desired signal during a corresponding time duration, the method further including the step of the processor estimating intermodulation distortion performance based upon measurements of signal strength at each of a plurality of rake fingers.

* * * * *